United States Patent
Cartier, Jr. et al.

(10) Patent No.: US 11,057,995 B2
(45) Date of Patent: Jul. 6, 2021

(54) BACKPLANE FOOTPRINT FOR HIGH SPEED, HIGH DENSITY ELECTRICAL CONNECTORS

(71) Applicant: Amphenol Corporation, Wallingford, CT (US)

(72) Inventors: Marc B. Cartier, Jr., Dover, NH (US); Mark W. Gailus, Concord, MA (US); Tom Pitten, Merrimack, NH (US); Donald A. Girard, Jr., Bedford, NH (US); Huilin Ren, Amherst, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 16/435,781

(22) Filed: Jun. 10, 2019

(65) Prior Publication Data

US 2019/0380204 A1  Dec. 12, 2019

Related U.S. Application Data

(60) Provisional application No. 62/683,146, filed on Jun. 11, 2018.

(51) Int. Cl.
  *H05K 1/11* (2006.01)
  *H01R 13/66* (2006.01)
  *H05K 1/14* (2006.01)

(52) U.S. Cl.
  CPC ......... *H05K 1/115* (2013.01); *H01R 13/6658* (2013.01); *H05K 1/117* (2013.01); *H05K 1/145* (2013.01)

(58) Field of Classification Search
  CPC ........ H05K 1/115; H05K 1/117; H05K 1/145; H01R 13/6658
  (Continued)

(56) References Cited

U.S. PATENT DOCUMENTS 4,632,476 A   12/1986  Schell
4,806,107 A    2/1989  Arnold et al.
(Continued)

FOREIGN PATENT DOCUMENTS

CN       1329812 A     1/2002
CN       1918952 A     2/2007
(Continued)

OTHER PUBLICATIONS

U.S. Appl. No. 16/214,298, filed Dec. 10, 2018, Charbonneau et al.
(Continued)

*Primary Examiner* — Timothy J Thompson
*Assistant Examiner* — Michael F McAllister
(74) *Attorney, Agent, or Firm* — Wolf, Greenfield & Sacks, P.C.

(57) ABSTRACT

A printed circuit board includes a plurality of layers including conductive layers separated by dielectric layers; and at least one via configured for solder attachment to a connector lead of a surface mount connector, the at least one via including a conductive element that extends from an upper surface of the printed circuit board through one or more of the plurality of layers, the conductive element having a recess in a surface thereof. The recess is configured to receive a tip portion of the connector lead of the surface mount connector. The printed circuit board may have via patterns including signal vias and ground vias.

14 Claims, 7 Drawing Sheets

(58) Field of Classification Search
USPC .......................................................... 174/115
See application file for complete search history.

(56) References Cited

U.S. PATENT DOCUMENTS

| | | | |
|---|---|---|---|
| 4,846,727 | A | 7/1989 | Glover et al. |
| 4,975,084 | A | 12/1990 | Fedder et al. |
| 5,038,252 | A | 8/1991 | Johnson |
| 5,066,236 | A | 11/1991 | Broeksteeg |
| 5,120,258 | A * | 6/1992 | Carlton ................ H01R 24/50 439/581 |
| 5,429,520 | A | 7/1995 | Morlion et al. |
| 5,429,521 | A | 7/1995 | Morlion et al. |
| 5,433,617 | A | 7/1995 | Morlion et al. |
| 5,433,618 | A | 7/1995 | Morlion et al. |
| 5,484,310 | A | 1/1996 | McNamara et al. |
| 5,496,183 | A | 3/1996 | Soes et al. |
| 5,828,555 | A | 10/1998 | Itoh |
| 6,166,615 | A * | 12/2000 | Winslow ................ H01P 1/04 333/243 |
| 6,181,219 | B1 * | 1/2001 | Gailus ................ H05K 1/024 174/262 |
| 6,183,301 | B1 * | 2/2001 | Paagman ............ H01R 23/688 439/607.05 |
| 6,293,827 | B1 | 9/2001 | Stokoe |
| 6,299,438 | B1 | 10/2001 | Sahagian et al. |
| 6,384,341 | B1 | 5/2002 | Rothermel et al. |
| 6,394,822 | B1 | 5/2002 | McNamara |
| 6,503,103 | B1 | 1/2003 | Cohen et al. |
| 6,607,402 | B2 | 8/2003 | Cohen et al. |
| 6,663,442 | B1 | 12/2003 | Helster et al. |
| 6,696,732 | B2 * | 2/2004 | Matsuoka ......... H01L 21/76895 257/365 |
| 6,776,659 | B1 | 8/2004 | Stokoe et al. |
| 6,843,657 | B2 * | 1/2005 | Driscoll .............. H05K 7/1454 439/65 |
| 6,910,897 | B2 * | 6/2005 | Driscoll ............ H01R 12/7011 439/65 |
| 7,139,177 | B2 | 11/2006 | Gottlieb |
| 7,163,421 | B1 | 1/2007 | Cohen et al. |
| 7,239,526 | B1 | 7/2007 | Bibee |
| 7,448,909 | B2 | 11/2008 | Regnier et al. |
| 7,633,766 | B2 | 12/2009 | Regnier et al. |
| 7,645,944 | B2 | 1/2010 | Casher et al. |
| 7,705,246 | B1 | 4/2010 | Pritchard et al. |
| 7,731,537 | B2 | 6/2010 | Amleshi et al. |
| 7,794,278 | B2 | 9/2010 | Cohen et al. |
| 7,819,697 | B2 | 10/2010 | Glover et al. |
| 7,897,880 | B1 | 3/2011 | Goergen et al. |
| 7,985,097 | B2 | 7/2011 | Gulla |
| 8,080,738 | B2 | 12/2011 | Morgan |
| 8,241,067 | B2 * | 8/2012 | Girard, Jr. ............... H05K 3/34 439/620.21 |
| 8,251,745 | B2 | 8/2012 | Johnescu et al. |
| 8,273,994 | B2 | 9/2012 | Reynov et al. |
| 8,715,006 | B2 | 5/2014 | Jeon |
| 8,841,560 | B1 | 9/2014 | Roberts |
| 8,889,999 | B2 | 11/2014 | Thurairajaratnam et al. |
| 9,202,783 | B1 | 12/2015 | Simpson et al. |
| 9,544,992 | B2 | 1/2017 | Minich |
| 9,585,259 | B1 | 2/2017 | Reynov |
| 9,640,913 | B1 * | 5/2017 | Wang ................ H01R 13/6471 |
| 9,775,231 | B2 | 9/2017 | Cartier, Jr. |
| 9,807,869 | B2 | 10/2017 | Gailus et al. |
| 9,923,293 | B2 * | 3/2018 | Swernofsky .......... H01R 12/55 |
| 9,930,772 | B2 | 3/2018 | Morgan et al. |
| 10,034,366 | B2 | 7/2018 | Gailus et al. |
| 10,187,972 | B2 | 1/2019 | Charbonneau et al. |
| 10,201,074 | B2 | 2/2019 | Charbonneau et al. |
| 10,375,822 | B2 | 8/2019 | Li et al. |
| 10,455,689 | B2 | 10/2019 | Gailus et al. |
| 10,485,097 | B2 | 11/2019 | Charbonneau et al. |
| 2002/0179332 | A1 | 12/2002 | Uematsu et al. |
| 2003/0188889 | A1 | 10/2003 | Straub et al. |
| 2004/0115968 | A1 | 6/2004 | Cohen |
| 2004/0150970 | A1 | 8/2004 | Lee |
| 2004/0183212 | A1 | 9/2004 | Alcoe |
| 2004/0263181 | A1 | 12/2004 | Ye et al. |
| 2005/0161254 | A1 | 7/2005 | Clink et al. |
| 2005/0201065 | A1 | 9/2005 | Regnier et al. |
| 2005/0202722 | A1 | 9/2005 | Regnier et al. |
| 2005/0245105 | A1 * | 11/2005 | Driscoll ............ H01R 12/7011 439/65 |
| 2006/0022303 | A1 | 2/2006 | Desai et al. |
| 2006/0090933 | A1 | 5/2006 | Wig et al. |
| 2006/0091545 | A1 | 5/2006 | Casher et al. |
| 2006/0185890 | A1 | 8/2006 | Robinson |
| 2006/0244124 | A1 | 11/2006 | Ohlsson |
| 2007/0130555 | A1 | 6/2007 | Osaka |
| 2008/0093726 | A1 | 4/2008 | Preda et al. |
| 2008/0237893 | A1 | 10/2008 | Quach et al. |
| 2008/0283285 | A1 | 11/2008 | Frech et al. |
| 2008/0308313 | A1 | 12/2008 | Gorcea |
| 2008/0318450 | A1 | 12/2008 | Regnier et al. |
| 2009/0188711 | A1 | 7/2009 | Ahmad |
| 2010/0101083 | A1 | 4/2010 | Lee et al. |
| 2010/0307798 | A1 | 12/2010 | Izadian |
| 2011/0062593 | A1 | 3/2011 | Abe et al. |
| 2011/0232955 | A1 | 9/2011 | Morgan |
| 2012/0003848 | A1 | 1/2012 | Casher et al. |
| 2012/0167386 | A1 | 7/2012 | Goergen et al. |
| 2012/0199380 | A1 | 8/2012 | Olsen |
| 2012/0243147 | A1 * | 9/2012 | Marconi ................ B23K 1/20 361/679.01 |
| 2012/0243184 | A1 | 9/2012 | Lee |
| 2012/0252232 | A1 | 10/2012 | Buck et al. |
| 2013/0056255 | A1 | 3/2013 | Biddle et al. |
| 2013/0077268 | A1 | 3/2013 | Brunker et al. |
| 2013/0098671 | A1 | 4/2013 | Thurairajaratnam et al. |
| 2013/0109232 | A1 | 5/2013 | Paniagua |
| 2013/0112465 | A1 | 5/2013 | Duvanenko |
| 2013/0175077 | A1 | 7/2013 | Kim et al. |
| 2013/0199834 | A1 | 8/2013 | De Geest et al. |
| 2013/0215587 | A1 | 8/2013 | Kawai |
| 2013/0330941 | A1 | 12/2013 | Jeon |
| 2014/0004724 | A1 | 1/2014 | Cartier, Jr. et al. |
| 2014/0140027 | A1 | 5/2014 | Enriquez Shibayama et al. |
| 2014/0182891 | A1 | 7/2014 | Rengarajan et al. |
| 2014/0197545 | A1 | 7/2014 | Chase et al. |
| 2014/0209370 | A1 | 7/2014 | Minich |
| 2015/0015288 | A1 * | 1/2015 | Ma ................ G01R 1/06738 324/754.03 |
| 2015/0114706 | A1 | 4/2015 | Rose et al. |
| 2015/0264801 | A1 | 9/2015 | Martin et al. |
| 2016/0150633 | A1 | 5/2016 | Cartier |
| 2016/0150639 | A1 | 5/2016 | Gailus et al. |
| 2016/0150645 | A1 * | 5/2016 | Gailus ................ H05K 1/115 174/266 |
| 2016/0183373 | A1 | 6/2016 | Williams et al. |
| 2017/0196079 | A1 | 7/2017 | Morgan et al. |
| 2017/0265296 | A1 | 9/2017 | Charbonneau et al. |
| 2018/0324941 | A1 | 11/2018 | Gailus et al. |
| 2019/0110359 | A1 | 4/2019 | Charbonneau et al. |
| 2019/0150273 | A1 | 5/2019 | Charbonneau et al. |

FOREIGN PATENT DOCUMENTS

| | | |
|---|---|---|
| CN | 201709040 U | 1/2011 |
| CN | 102265708 A | 11/2011 |
| JP | 2000-183242 A | 6/2000 |
| JP | 2002-531960 A | 9/2002 |
| JP | 2007-142307 A | 6/2007 |
| JP | 2009-059873 A | 3/2009 |
| WO | WO 00/33640 A1 | 6/2000 |
| WO | WO 2009/023238 A1 | 2/2009 |
| WO | WO 2010/111379 A2 | 9/2010 |
| WO | WO 2014/105435 A1 | 7/2014 |

OTHER PUBLICATIONS

U.S. Appl. No. 16/223,195, filed Dec. 18, 2018, Charbonneau et al.
U.S. Appl. No. 16/578,637, filed Sep. 23, 2019, Gailus et al.
U.S. Appl. No. 16/666,536, filed Oct. 29, 2019, Charbonneau et al.

(56) References Cited

OTHER PUBLICATIONS

U.S. Appl. No. 16/578,637, Gailus et al., filed Sep. 23, 2019.
U.S. Appl. No. 16/666,536, Charbonneau et al., filed Oct. 29, 2019.
Extended European Search Report for European Application No. 14745727.9 dated Oct. 21, 2016.
International Search Report and Written Opinion dated Mar. 8, 2016 for Application No. PCT/US2015/061907.
International Preliminary Report on Patentability dated Jun. 1, 2017 for Application No. PCT/US2015/061907.
International Search Report and Written Opinion dated Apr. 8, 2016 for Application No. PCT/US2015/061919.
International Preliminary Report on Patentability dated Jun. 1, 2017 for Application No. PCT/US2015/061919.
International Search Report and Written Opinion dated Apr. 8, 2016 for Application No. PCT/US2015/061930.
International Preliminary Report on Patentability dated Jun. 1, 2017 for Application No. PCT/US2015/061930.
International Search Report and Written Opinion dated May 31, 2017 for Application No. PCT/US2017/021158.
International Preliminary Report on Patentability dated Sep. 20, 2018 for Application No. PCT/US2017/021158.
International Search Report and Written Opinion for International Application No. PCT/US2018/059757 dated Mar. 7, 2019.
International Search Report and Written Opinion for International Application No. PCT/US2019/036285 dated Sep. 27, 2019.
[No Author Listed], ExaMAX™ Connector System, press-fit products. FCI Application Specification No. GS-20-0361. Preliminary. Revision 6. Mar. 12, 2014. 25 pages.
[No Author Listed], SFF-8643 Specification for Mini Multilane 12 Gbs ¾x Unshielded Connector, Rev 2.3. SFF Committee, Jan. 11, 2011, 24 pages.
[No Author Listed], Strada Whisper Connector Daughtercard Footprint. Tyco Electronics, Mar. 24, 2010, 1 page.
[No Author Listed], Strada Whisper High Speed Backplane Connector System. Tyco Electronics. Presentation. Mar. 24, 2010. 15 pages.
[No Author Listed], Zipline Connector System, http://www.slideshare.net/element14/zipline-connector-system Mar. 10, 2011. Last accessed Oct. 12, 2015. 15 pages.

* cited by examiner

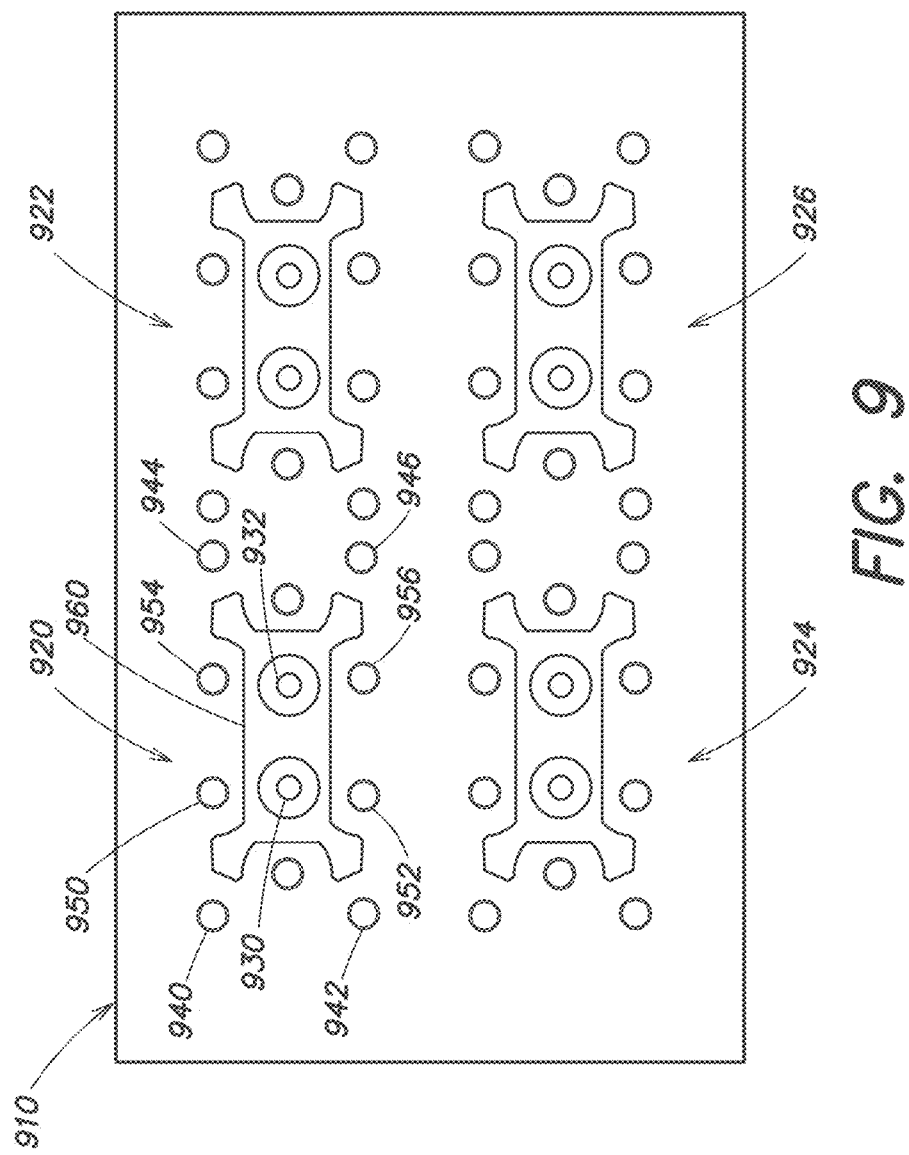

BACKPLANE FOOTPRINT FOR HIGH SPEED, HIGH DENSITY ELECTRICAL CONNECTORS

CROSS REFERENCE TO RELATED APPLICATION

This application claims priority based on Provisional Application No. 62/683,146, filed Jun. 11, 2018, which is hereby incorporated by reference in its entirety.

BACKGROUND

This patent application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards ("PCBs"), which may be joined together with electrical connectors. A known arrangement for joining several printed circuit boards is to have one printed circuit board serve as a backplane. Other printed circuit boards, called "daughter boards" or "daughter cards," may be connected through the backplane.

A known backplane has the form of a printed circuit board onto which many connectors may be mounted. Conductive traces in the backplane may be electrically connected to signal conductors in the connectors so that signals may be routed between the connectors. Daughter cards may also have connectors mounted thereon. The connectors mounted on a daughter card may be plugged into the connectors mounted on the backplane. In this way, signals may be routed among the daughter cards through the backplane. The daughter cards may plug into the backplane at a right angle. The connectors used for these applications may therefore include a right angle bend and are often called "right angle connectors." Other known connectors include, but are not limited to, orthogonal midplane connectors and midplaneless direct attachment orthogonal connectors.

Connectors may also be used in other configurations for interconnecting printed circuit boards and for interconnecting other types of devices, such as cables, to printed circuit boards. Sometimes, one or more smaller printed circuit boards may be connected to another larger printed circuit board. In such a configuration, the larger printed circuit board may be called a "mother board" and the printed circuit boards connected to it may be called daughter boards. Also, boards of the same size or similar sizes may sometimes be aligned in parallel. Connectors used in these applications are often called "stacking connectors" or "mezzanine connectors."

A "midplane" configuration is also sometimes used. The midplane is similar to a backplane in that it has connectors positioned to make connection with multiple daughter boards. In a midplane, however, the connectors are attached to opposing surfaces of the midplane such that daughter boards may be installed in the system on both sides of the midplane. Frequently, the daughter boards on one side are orthogonal to the daughter boards installed on the other side, which can shorten the signal paths from one daughter board to another relative to having the daughter boards aligned in parallel and connected through a backplane. Specialized connectors are sometimes used for a midplane configuration, but that configuration may also be created with the same connectors used in a backplane configuration.

An orthogonal arrangement of daughter boards may also be created without a midplane by using connectors on the daughter boards on one side of an electronic assembly that can directly mate to connectors on the daughter boards on the other side of the assembly. This configuration is called "direct mate orthogonal." This configuration may be created with right angle connectors as might be used on a daughter board in a backplane configuration on the daughter boards on one side of the assembly. Connectors designed for this direct mate orthogonal configuration are used on the boards on the other side of the assembly.

Regardless of the exact application, electrical connector designs must keep pace with trends in the electronics industry. Electronic systems generally have gotten smaller, faster, and functionally more complex. Because of these changes, the number of circuits in a given area of an electronic system, along with the frequencies at which the circuits operate, have increased significantly in recent years. Current systems pass more data between printed circuit boards and require electrical connectors that are electrically capable of handling more data at higher speeds than connectors of even a few years ago.

In a high density, high speed connector, electrical conductors may be so close to each other that there may be electrical interference between adjacent signal conductors. To reduce interference, and to otherwise provide desirable electrical properties, shield members are often placed between or around adjacent signal conductors. The shields may prevent signals carried on one conductor from creating "crosstalk" on another conductor. The shield may also impact the impedance of each conductor, which may further affect electrical properties.

Other techniques may be used to control the performance of a connector. For example, transmitting signals differentially may reduce crosstalk. Differential signals are carried on a pair of conductive paths, called a "differential pair." The voltage difference between the conductive paths represents the signal. In general, a differential pair is designed with preferential coupling between the conductive paths of the pair. For example, the two conductive paths of a differential pair may be arranged to run closer to each other than to adjacent signal paths in the connector. No shielding is desired between the conductive paths of the pair, but shielding may be used between differential pairs. Electrical connectors can be designed for differential signals as well as for single-ended signals.

In an interconnection system, such connectors are attached to printed circuit boards, one of which may serve as a backplane for routing signals between the electrical connectors and for providing reference planes to which reference conductors in the connectors may be grounded. Typically the backplane is formed as a multi-layer assembly manufactured from stacks of dielectric sheets, sometimes called "prepreg". Some or all of the dielectric sheets may have a conductive film on one or both surfaces. Some of the conductive films may be patterned, using lithographic or laser printing techniques, to form conductive traces that are used to make interconnections between circuit boards, circuits and/or circuit elements. Others of the conductive films may be left substantially intact and may act as ground planes or power planes that supply the reference potentials. The dielectric sheets may be formed into an integral board structure such as by pressing the stacked dielectric sheets together under pressure.

As in the case of the connectors that attach to the printed circuit boards, the electrical performance of printed circuit boards is at least partially dependent on the structures of the conductive traces, ground planes and vias formed in the printed circuit boards. Further, electrical performance issues become more acute as the density of signal conductors and the operating frequencies of the connectors increase.

To make electrical connections to the conductive traces or ground/power planes, holes may be drilled through the printed circuit board. These holes, or "vias", are filled or plated with metal such that a via is electrically connected to one or more of the conductive traces or planes through which it passes.

In one approach for attaching connectors to the printed circuit board, known as "press fit technology", contact pins or contact "tails" from the connectors may be inserted into the vias, with or without using solder. The vias are sized to accept the contact tails of the connector. In another approach for attaching connectors to the printed circuit board, known as "surface mount technology", the vias are provided with conductive pads on the surface of the printed circuit board and the contact pins of the connector are soldered to the conductive pads. In the surface mount technology, the vias may have smaller diameters than vias for receiving contact pins of the connector.

As indicated above, a trend in electronic systems is toward increasing miniaturization, higher speed operation and functional complexity. In order to meet the demands for miniaturization, the density of connector pins must increase while avoiding degradation in electrical performance. Likewise, the printed circuit boards to which the high speed high density connectors are attached must be miniaturized, while maintaining electrical performance. In addition, the connectors, the printed circuit boards and the connections between the connectors and the printed circuit boards must have high reliability.

Press fit connectors have contact tails which are inserted into holes in corresponding vias in the printed circuit board. The contact tails may be slightly deformed as they are inserted into the via holes, thereby providing a reliable electrical and mechanical connection. Furthermore, the contact tails may be soldered to the printed circuit board. However, the miniaturization of press fit connectors is limited by the design of the press fit contact tails. In other words, the press fit contact tails have a minimum width to ensure reliable operation. In addition, printed circuit boards designed for attachment to press fit connectors require a zone in the upper portion of the printed circuit board in which the vias are large enough to accept the press fit contact tails, leaving little or no area for routing signal traces.

Surface mount connectors do not require holes for receiving the contact tails. Instead, the contact pins of the surface mount connector physically contact conductive pads on the surface of the printed circuit board. The contact pins of the connector are soldered to the conductive pads to provide an electrical connection. While surface mount connectors do not have the disadvantage of requiring via holes large enough to accept contact tails, surface mount connectors may have issues with respect to reliable electrical contact between the contact pin and the conductive pad on the printed circuit board. In particular, the surface mount contact pins may not be coplanar due to manufacturing tolerances. Furthermore, the conductive pads on the printed circuit board may not be coplanar due to manufacturing tolerances. As a result, when the surface mount connector is placed in contact with the printed circuit board, some of the surface mount contact pins may contact the conductive pads while others are spaced above the conductive pads. In the soldering operation, solder may bridge the gaps between the contact pins and the conductive pads, but in some cases an open connection may result. Even if the solder does bridge the gap between the contact pin and the conductive pad, the connection may be unreliable.

Accordingly, there is a need for improved printed circuit boards and connector footprints for high speed, high density electrical applications.

SUMMARY

The inventors have recognized that interconnection systems require new structures in order to satisfy requirements for smaller sizes, higher operating frequencies and increased complexity. An interconnection system in accordance with embodiments includes a surface mount connector and a printed circuit board having structures for solder attachment to connector leads of the surface mount connector. In embodiments, the printed circuit board includes one or more conductive elements on its upper surface for solder attachment to respective connector leads of the surface mount connector. The conductive elements may comprise vias that extend through one or more layers of the printed circuit board.

Each of the conductive elements is provided with a recess that receives a tip portion of the connector lead. The tip portions of the connector leads of the surface mount connector may be tapered or otherwise configured for insertion into the recess in the conductive element of the printed circuit board. The recess enables a more reliable solder connection between the conductive element and the connector lead of the surface mount connector, as compared with a conductive element having a flat surface. The recess mitigates reliability issues caused by lack of coplanarity of the connector leads. The interconnection system enables a reduction in area requirements as compared with interconnection systems that rely upon press fit insertion of connector pins into corresponding vias on the printed circuit board.

In accordance with embodiments, a printed circuit board comprises at least one dielectric layer and at least one conductive element formed on the dielectric layer and configured for solder attachment to a connector lead of a surface mount connector, the conductive element having a recess in a surface thereof.

In accordance with further embodiments, a printed circuit board comprises a plurality of layers including conductive layers separated by dielectric layers and at least one via configured for solder attachment to a connector lead of a surface mount connector, the at least one via comprising a conductive element that extends from an upper surface of the printed circuit board through one or more of the plurality of layers, the conductive element having a recess in a surface thereof.

In accordance with further embodiments, a printed circuit board comprises a plurality of layers including conductive layers separated by dielectric layers and via patterns formed in the plurality of layers, each of the via patterns comprising first and second signal vias extending from a first surface of the printed circuit board to a breakout layer of the conductive layers, and ground vias connected to one or more of the conductive layers, wherein the signal vias and the ground vias each include a conductive element having a recess in a surface thereof.

In some embodiments, the recess has a depth in a range of 0.05 mm to 0.30 mm.

In some embodiments, the recess has an aspect ratio of depth to width in a range of 1 to 4.

In some embodiments, the via extends from the upper surface of the printed circuit board to a breakout layer of the conductive layers.

In some embodiments, the recess is centered on the via.

In some embodiments, the recess is offset from a center of the via.

In some embodiments, the at least one via is backdrilled from a second surface of the printed circuit board.

In some embodiments, the recess includes a conical portion.

In some embodiments, the recess includes a truncated conical portion.

In some embodiments, the recess includes a cylindrical portion.

In some embodiments, the recess includes a hemispherical portion.

In some embodiments, the via extends from the upper surface of the printed circuit board to a ground layer of the conductive layers.

In some embodiments, the recess is configured to receive a tip portion of the connector lead of the surface mount connector.

In some embodiments, the recess is configured to receive solder of a solder joint between the at least one via and the connector lead of the surface mount connector.

In some embodiments, the recess is configured to allow a tip portion of the connector lead of the surface mount connector to extend below the upper surface of the printed circuit board.

In some embodiments, the at least one via includes a conductive pad on the upper surface of the printed circuit board and wherein the conductive pad has a larger diameter than the conductive element of the at least one via.

In some embodiments, the at least one via comprises a cylindrical conductor that extends at least part way through the printed circuit board.

In some embodiments, the at least one via is filled with a conductive material, except for the recess.

In some embodiments, the at least one via is configured for attachment to a superelastic connector lead of the surface mount connector.

In accordance with further embodiments, a method is provided for manufacturing a printed circuit board comprising a plurality of conductive layers separated by dielectric layers. The method comprises drilling a hole through the printed circuit board, filling the hole with conductive material to form a via, and forming a recess in the conductive material of the via at an upper surface of the printed circuit board.

In accordance with further embodiments, an interconnection system comprises a surface mount component comprising surface mount leads; and a printed circuit board comprising conductive layers separated by dielectric layers, and vias configured for solder attachment to respective leads of the surface mount component, each of the vias including a conductive element having a recess in an upper surface thereof.

In some embodiments, at least 95% of the surface mount leads comprise distal tips extending into respective recesses.

BRIEF DESCRIPTION OF THE DRAWINGS

For a better understanding of the disclosed technology, reference is made to the accompanying drawings, which are incorporated herein by reference and in which:

FIG. 9 is a top view of a printed circuit board showing via patterns in accordance with embodiments.

DETAILED DESCRIPTION

The inventors have recognized and appreciated that, though substantial focus has been placed on providing improved electrical connectors in order to improve the performance of interconnection systems, at some very high frequencies significant performance improvement may be achieved by inventive designs for printed circuit boards. In accordance with some embodiments, improvements may be achieved by inventive designs for connector footprints and for the details of the connector footprints, including but not limited to vias of the connector footprints. The inventive designs may improve the electrical performance of the interconnection system, may improve the reliability of the connection between the printed circuit board and the connector and/or may facilitate further miniaturization of the interconnection system, for example.

As used herein, the terms "connector footprint" and "backplane footprint" refer to elements of a printed circuit board which are configured to interface to a connector. The connector footprint may include multiple via patterns, and each via pattern may include one or more signal vias and one or more ground vias. Each via pattern may further include one or more additional vias configured for shielding, impedance control and the like. However, the via patterns are not limited with respect to the numbers or types of vias. Further, the terms "printed circuit board" and "backplane" are used interchangeably herein to refer to a structure including conductive layers and dielectric layers in an alternating arrangement. However, it should be appreciated that attachment techniques as described herein may be used to attach connectors, or any other type of electrical component, to a substrate having layers and connections between the layers, including daughter boards or midplanes. These techniques may be used with substrates of any thickness.

In some embodiments, the printed circuit board may include a single dielectric layer and a single conductive layer. However, the techniques described herein may provide valuable advantages in terms of speed and/or manufacturing cost when used with multi-layer boards, such as boards with more than 10 conductive layers carrying signal traces, or more than 20 layers or in some embodiments, more than 40 layers. Accordingly, in some embodiments, techniques as described herein may be applied with printed circuit boards with between 10 and 50 layers with signal traces.

Figure 1:
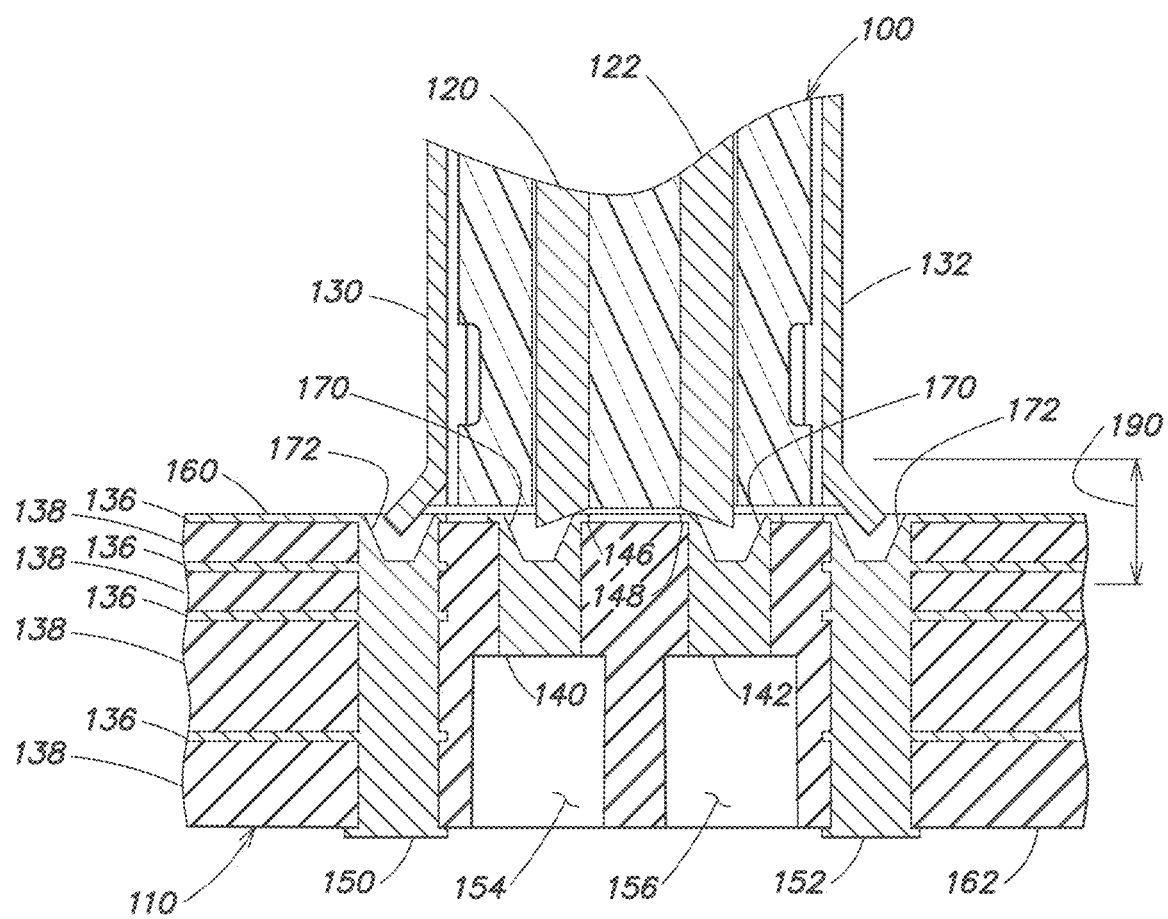
FIGS. 1 and 2 are cross-sectional views of an interconnection system including a surface mount electrical connector and a printed circuit board in accordance with embodiments.
Figure 2:
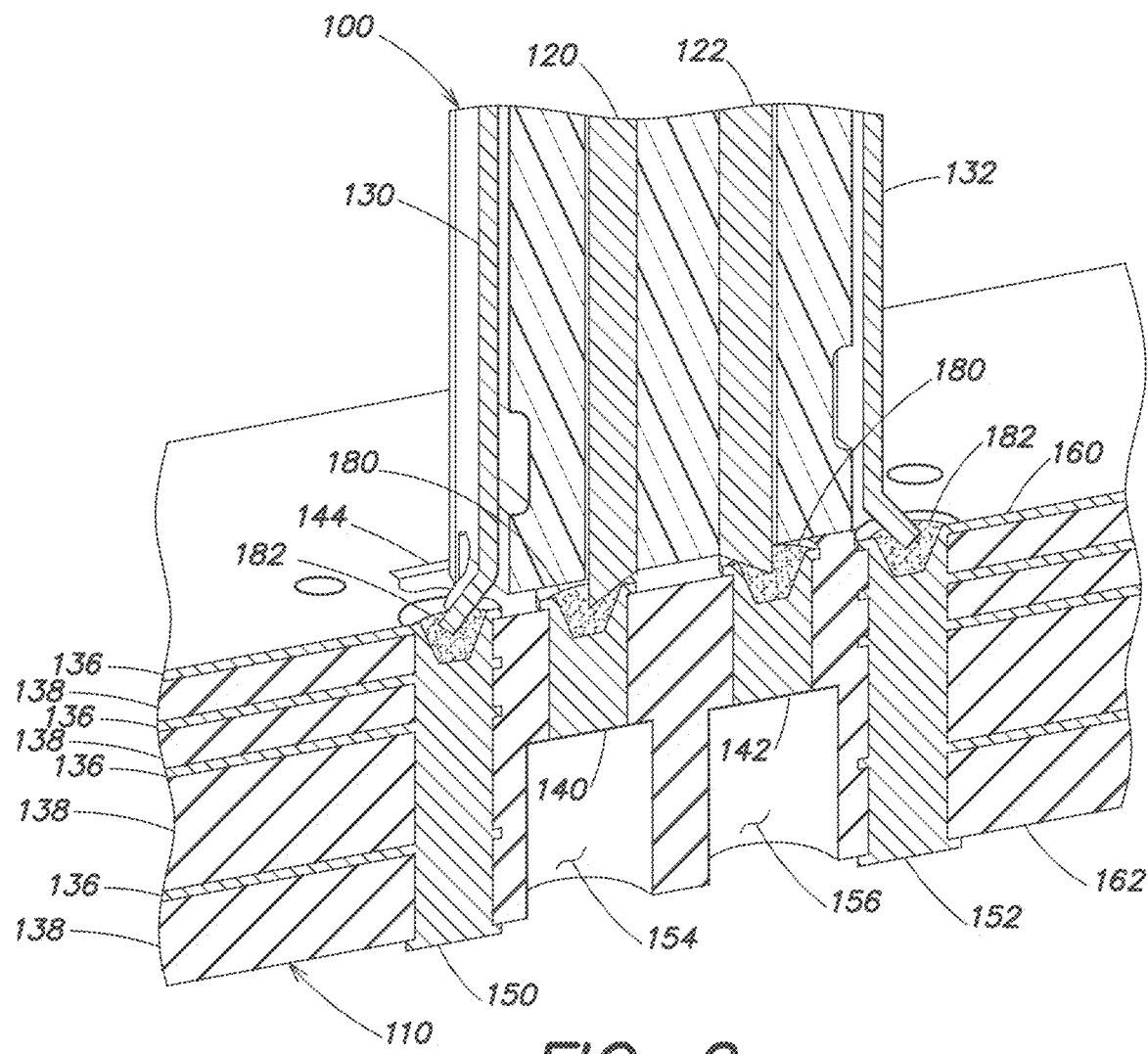

FIGS. 1 and 2 illustrate an example of an electrical interconnection system that may be used in an electronic system, in accordance with embodiments. The electrical connection system includes a connector that may be electrically and mechanically connected to a printed circuit board. In this example, a surface mount connector 100 is configured to be attached to a printed circuit board 110.

The surface mount connector 100 may include a number of pairs of signal leads and corresponding ground leads. One pair of signal leads and corresponding ground leads are shown in FIGS. 1 and 2. Surface mount connector 100 includes signal leads 120 and 122 and corresponding ground leads 130 and 132. The signal leads 120 and 122 may form a differential pair. Additional ground leads, not shown, may correspond to each pair of signal leads.

As shown in FIGS. 1 and 2, signal leads 120 and 122 of the surface mount connector 100 may have beveled tip portions and ground leads 130 and 132 may have tapered tip portions. In addition, ground leads 130 and 132 may have bent tip portions. As discussed below, these features enable insertion of the tip portions into the recesses in respective vias of printed circuit board 110. In general, the tip portions of the connector leads of surface mount connector 100 are sized and shaped for insertion into corresponding recesses in the printed circuit board 110. The tip portions may be beveled, tapered, reduced in dimension or otherwise configured for insertion into corresponding recesses. In some cases, modification of the tip portions of the connector leads may not be required, and the tip portion may be cylindrical, rectangular, or have any other suitable shape.

The printed circuit board 110 may include a plurality of conductive layers separated by dielectric layers, as described below. For example, the printed circuit board 110 may include conductive layers 136 separated by dielectric layers 138 in an alternating arrangement. The printed circuit board 110 may include a signal via 140 corresponding to signal lead 120 and a signal via 142 corresponding to signal lead 122. The printed circuit board 110 may further include a ground via 150 corresponding to ground lead 130 and a ground via 152 corresponding to ground lead 132. The signal leads 120 and 122 are electrically and mechanically connected to the respective signal vias 140 and 142 by solder joints 180 (shown in FIG. 2), and the ground leads 130 and 132 are electrically and mechanically connected to the respective ground vias 150 and 152 by solder joints 182 (shown in FIG. 2).

As best shown in FIG. 2, the conductive layer 136 on the top surface of printed circuit board 110 may be patterned to form an antipad 144. The antipad 144 is a region where conductive layer 136 has been removed. The antipad 144 provides clearance between signal vias 140 and 142 and conductive layer 136, which may be connected to ground. Antipads may be provided as needed in additional conductive layers of the printed circuit board 110. Ground vias 150 and 152 are connected to conductive layers 136, and signal vias 140 and 142 are isolated from conductive layers 136. Ground vias 150 and 152 may extend through all the layers of printed circuit board 110 and may be connected to several conductive layers 136 which serve as ground planes.

Signal vias 140 and 142 may include conductive pads 146 and 148, respectively, on a top surface 160 of printed circuit board 110. Signal vias 140 and 142 extend from top surface 160 of printed circuit board 110 to a breakout layer (shown in FIG. 3), where the signal vias 140 and 142 are connected to signal traces (shown in FIG. 3) for interconnection to other elements of the printed circuit board. In the embodiment of FIGS. 1 and 2, signal vias 140 and 142 are backdrilled from a bottom surface 162 of printed circuit board 110 to a point slightly below the breakout layer. Thus, holes 154 and 156 below signal vias 140 and 142, respectively, are air holes.

As shown in FIG. 1, mounting ends of signal leads 120 and 122 press against conductive structures, here conductive pads 146 and 148, on the top surface 160 of printed circuit board 110. As a result, edges of the signal leads 120 and 122 may make contact with signal vias 140 and 142, without requiring the signal vias 140 and 142 to be large enough to accommodate a pressfit or similar structure. As a result, signal vias 140 and 142 may be smaller diameter than in a conventional connector footprint, such that the footprint for connector may be smaller diameter than for a conventional connector. As shown in FIG. 1, signal vias 140 and 142 are filled vias, rather than plated through holes, which conventionally require a larger diameter than filled vias.

As shown in FIG. 1, each of the signal vias 140, 142 is provided with a recess 170, and each of the ground vias 150, 152 is provided with a recess 172. In the embodiment of FIGS. 1 and 2, each of the recesses 170, 172 has a truncated conical shape. The recesses are described in detail below.

As shown in FIG. 2, the recesses 170 and 172 are filled with solder to form solder joints 180 and 182, respectively. The signal leads 120 and 122 are electrically and mechanically connected to the respective signal vias 140 and 142 by solder joints 180, and the ground leads 130 and 132 are electrically and mechanically connected to the respective conductive elements 150 and 152 by solder joints 182.

As shown in FIG. 2, the solder joints 180 and 182 extend into the respective recesses 170 and 172 and improve the reliability of the connection between the connector leads and the vias of the printed circuit board. In particular, the recesses 170 and 172 provide a greater surface area for contact with the solder joints 180 and 182, as compared with vias having flat upper surfaces. Furthermore, the recesses 170 and 172 permit a greater volume of solder to be utilized in each solder joint, as compared with vias having flat upper surfaces. The greater solder volume also improves the reliability of the solder joint. In addition, the fact that signal leads 120 and 122 and ground leads 130 and 132 may extend into the respective recesses 170 and 172 mitigates the effects of lack of coplanarity of the connector leads of the surface mount connector, as discussed below.

The features of the solder joints 180 and 182, including increased solder volume, increased solder contact area and the extension of the solder joints 180 and 182 into the respective recesses, increase the shear resistance of the solder joints 180 and 182. In particular, the solder joints 180 and 182 are unlikely to be sheared off in a direction parallel to the surface of the printed circuit board. It will be understood that the above features of the solder joints 180 and 182 are not requirements.

The above-described features of the solder joints 180 and 182, including increased solder volume, increased solder contact area and extension of the solder joints into the recesses, may benefit the mechanical reliability of the solder joints, and, in addition, may affect the electrical performance of the connection. For example, the impedance of the connection may be changed by the increased solder volume. Thus, it may be preferable that the solder joint is distributed along the length of a signal line in the direction of signal propagation. As such, a narrow, deep recess may be preferable to a wide, shallow recess. The shape of the recess may be characterized, in part, by an aspect ratio of depth to width. In some embodiments, the aspect ratio of the recess may be in a range of 1 to 4, but this is not a limitation.

As shown in FIG. 2, ground leads 130 and 132 may be formed as part of a shield that encircles the signal leads 120 and 122.

Figure 3:
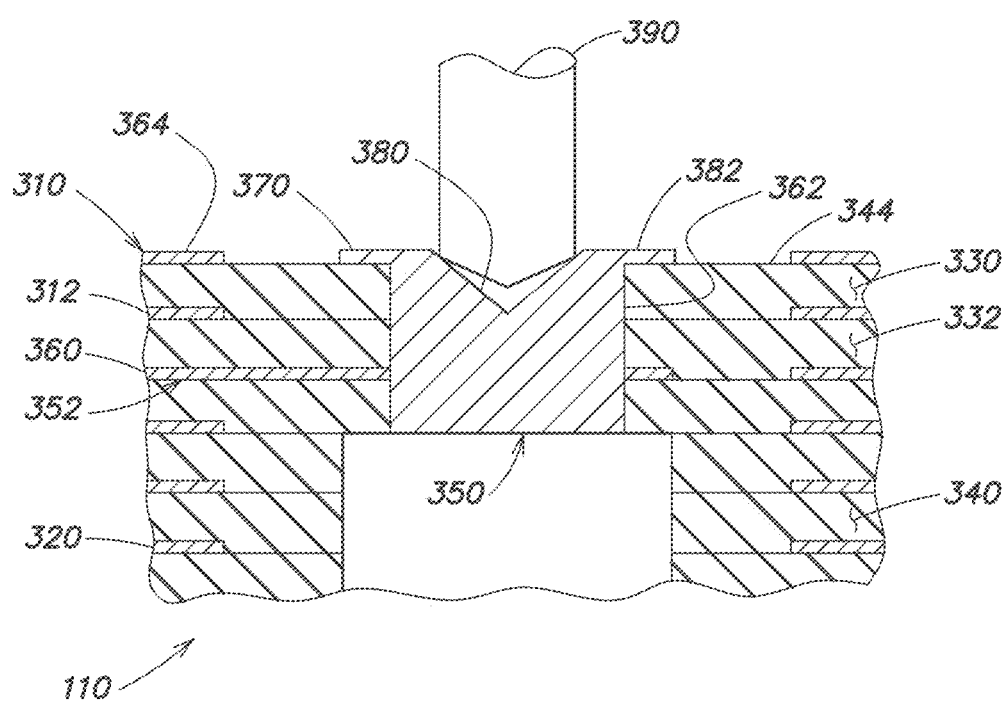
FIG. 3 is a cross-sectional view of a printed circuit board, showing a via in accordance with embodiments.

A cross section of printed circuit board 110 in accordance with embodiments is shown in FIG. 3. The printed circuit board 110 includes a plurality of layers including conductive layers 310, 312, . . . 320 separated by dielectric layers 330, 332, . . . 340 in an alternating arrangement. The printed circuit board 110 further includes a signal via 350. FIG. 3 shows the layered structure of printed circuit board 110. It will be understood that an actual printed circuit board may include multiple, closely spaced vias arranged in via patterns as described below.

As shown in FIG. 3, the printed circuit board 110 includes multiple layers, each layer including a conductive layer and a dielectric layer so that the printed circuit board 110 includes an alternating arrangement of conductive layers and dielectric layers. Each conductive layer may serve as a ground plane, may be patterned to form conductive traces, or may include a ground plane and conductive traces in different areas. The layers may be formed, during assembly, by stacking multiple sheets of laminate with patterned copper and prepreg and then pressing them under heat to fuse all the sheets. Patterning the copper may create traces and other conductive structures within the printed circuit board. As a result of fusing, the layers may not be structurally separable in a finished printed circuit board. However, the layers may nonetheless be recognized in the fused structure based on the positions of the conductive structures. Accordingly, FIG. 3 illustrates separation between the layers of dielectric material, even though those layers may be fused in a printed circuit board. The number of conductive layers and dielectric layers may vary according to application.

As further shown in FIG. 3, the conductive layers 310, 312, . . . 320 are removed in areas around signal via 350, except in a breakout layer 352. For example, an antipad 344 is formed between conductive layer 310 and signal via 350. The areas around signal via 350 where the conductive layers are removed, known as antipads, provide clearance between signal via 350 and those conductive layers which are not intended for connection to signal via 350. In breakout layer 352, a signal trace 360 is connected to signal via 350. The signal via 350 and the signal trace 360 provide an electrical connection between a signal lead of surface mount connector 100 (FIGS. 1 and 2) and another element of printed circuit board 110.

As further shown in FIG. 3, the signal via 350 is formed as a conductive element 362 that extends from top surface 364 of printed circuit board 110 at least to breakout layer 352 where signal trace 360 is connected to signal via 350. The signal via 350 may be formed by drilling a hole through the conductive layers and the dielectric layers of printed circuit board 110 and filling the hole with a conductive material. The conductive element 362 may be generally cylindrical in shape.

The signal via 350 may be backdrilled from the rear surface of printed circuit board 110 to a level slightly below breakout layer 352. The backdrilled portion of the hole is free of conductive material and avoids the formation of an electrical stub which may cause undesired resonance in the transmission characteristic of the signal line.

The signal via 350 may further include a conductive pad 370 on the top surface 364 of the printed circuit board 110. The conductive pad 370 may be formed by patterning conductive layer 310 on top surface 364 and is in electrical contact with conductive element 362 of signal via 350. The conductive pad 370 has a larger diameter than conductive element 362 and surrounds conductive element 362 on top surface 364.

As shown in FIG. 3, the signal via 350 includes a recess 380. The recess 380 extends from a top surface 382 of signal via 350 into the printed circuit board. The recess 380 may be characterized by a maximum diameter, a maximum depth and a shape. In the embodiment of FIG. 3, the recess 380 has a conical shape. However, this is not a limitation, and other shapes may be utilized, as discussed below.

By way of example only, the signal via 350 may have a diameter in a range of 0.10 mm to 0.30 mm and the conductive element 362 may extend all or part way through the printed circuit board 110. The recess 380 may have a diameter in a range of 0.08 mm to 0.28 mm and a depth in a range of 0.05 mm to 0.30 mm. In some embodiments, recess 380 may have a shape that concentrates solder generally to match the shape of connector lead 390. The diameter of the recess is based on the diameter of the signal via 350 so as to maintain a minimum wall thickness of the signal via 350 in the region of recess 380. The minimum wall thickness may be in a range of 0.02 mm to 0.08 mm. It will be understood that these dimensions are given by way of example only and are not limiting.

A function of the recess 380 is to receive at least a tip portion of a connector lead 390 of a surface mount connector. The tip portion of the connector lead 390 of the surface mount connector may be tapered, beveled or otherwise configured, to enable insertion of the tip portion into the recess 380. The dimensions and shape of the recess 380 may be selected to engage the tip portion of the connector lead of a particular surface mount connector, and different recess sizes and shapes may be utilized with different surface mount connectors. It is not the intent of the recess 380 to accept the entire connector lead 390 of a surface mount connector, as in the case of a contact tail of a press fit connector which is inserted into a corresponding via of the printed circuit board. Further, it is not the intent that the connector lead 390 of the surface mount connector rest on the surface of the printed circuit board without extending at least partially into the recess 380. By providing a configuration where the tip portion of the connector lead 390 of the surface mount connector extends into the recess 380, advantageous features, including but not limited to mitigating the effects of lack of coplanarity of the connector leads and improving the reliability of solder connections, may be achieved.

In some embodiments, the diameter and/or cross section of the connector lead 390 may be larger than the diameter of the recess 380, except at the tip portion of connector lead 390. In other embodiments, the diameter and/or cross section of the connector lead is smaller than the diameter of the recess 380, and insertion of the connector lead into the recess 380 is limited by the depth of the recess. In some cases, not all connector leads may extend into the respective recesses due to lack of coplanarity of the tip portions of the connector leads. In some embodiments, the recess 380 and the tip portion of connector lead 390 have different sizes and shapes, such that solder fills spaces between recess 380 and connector lead 390 and increases the reliability of the solder joint.

In some embodiments, the recess 380 may be centered with respect to signal via 350. In other embodiments, the recess 380 may be offset with respect to the center of signal via 350. The offset configuration may be used to control the impedance of the signal lines in a transition region between the printed circuit board and the surface mount connector. When the recess 380 is offset with respect to the center of signal via 350, a minimum wall thickness of the via is maintained in order to ensure electrical continuity of the via. The recess 380 typically has a circular cross section in a plane parallel to the top surface of the printed circuit board, but this is not a limitation.

Figure 4:
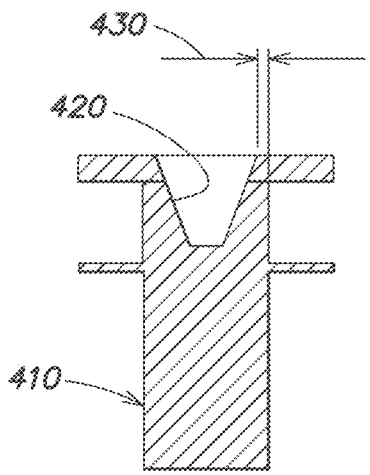
FIG. 4 is a cross-sectional view of a via having a truncated conical recess in accordance with embodiments.

A via 410 having a truncated conical recess 420 is shown in FIG. 4. A V-shaped recess, such as is characteristic of a conical recess or a truncated conical recess, provides a gradual transition in impedance from the connector to the printed circuit board. Further, the V-shaped recess provides self-centering of the connector lead and has a favorable depth to volume ratio for forming a reliable solder joint.

Figure 5:
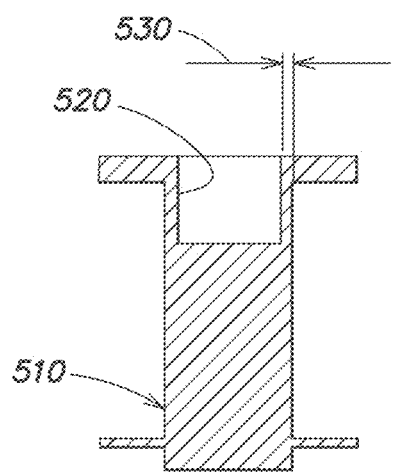
FIG. 5 is a cross-sectional view of a via having a cylindrical recess in accordance with embodiments.

A via 510 having a cylindrical recess 520 is shown in FIG. 5. A cylindrical recess with a flat bottom provides a transition in impedance between the surface mount connector 100 and the printed circuit board 110. A cylindrical recess can accept larger leads below the surface, as compared with a conical or truncated conical recess, for enhanced solder joint shear resistance. The cylindrical recess allows greater recess depths to improve shear resistance without the wall thickness issues associated with conical and truncated conical recesses.

Figure 6:
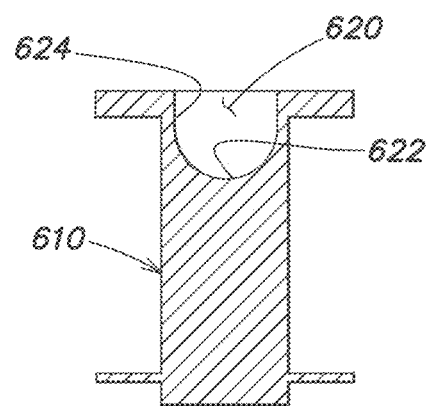
FIG. 6 is a cross-sectional view of a via having a recess with a hemispherical portion and a cylindrical portion in accordance with embodiments.

A via 610 having a recess 620 is shown in FIG. 6. The recess 620 has a hemispherical portion 622 and a cylindrical portion 624. A recess with a round-shaped bottom provides a transition in impedance between the surface mount connector 100 and the printed circuit board 110. The hemispherical recess can accept larger leads, as compared with the conical and truncated conical recesses, for enhanced solder joint shear resistance. The round-shaped bottom provides enhanced stress resistance by eliminating sharp corners that may act as stress concentration points during thermal cycling. In some embodiments, the cylindrical portion 624 may be omitted, such that the recess 620 includes only hemispherical portion 622.

The shape of the recess may depend in part on the process used to form the recess. For example, when the recess is drilled, the shape of the recess corresponds to the shape of the drill bit. In other embodiments, the recess may be formed by laser drilling and have a shape that conforms to laser drilling processes. Further, the size and shape of the recess may be selected based on the size and shape of the tip portion of the connector lead of the surface mount connector. The recess may have any size and shape that is compatible with the drilling process and which is capable of receiving a tip portion of the connector lead of the surface mount connector. Further, the shape of the recess may include portions with different shapes, such as hemispherical portion 622 and cylindrical portion 624, as shown in FIG. 6, a truncated conical portion and a cylindrical portion (not shown), a conical portion and a cylindrical portion (not shown), etc.

The depth of the recess is based on several factors. Where the bottom of the recess is not flat, the depth may be defined as the depth of the recess at its deepest point. The depth may be sufficient to compensate for a lack of coplanarity of the tip portions of the connector leads of the surface mount connector. For example, the depth of the recess may be based on the coplanarity specification of the surface mount connector such that the longest connector leads extend to or near the bottom of the recess, whereas the shortest connector leads are located at or near the top of the recess.

In some embodiments, the depth of the recess may be selected based on the tolerance with which the distal tip of connector lead 390 may be positioned with respect to top surface 364 when a connector is mounted to the printed circuit board. That tolerance may depend on the manufacturing tolerances of the connector and/or the printed circuit board. In some embodiments, that tolerance may be +/−0.08 mm. The connector and printed circuit board may be designed such that the tip of connector lead 390 is nominally 0.04 mm below the surface, such that, if the position of tip of lead 390 varies by up to 0.08 mm, it will neither fail to fit fully within the recess nor fail to contact solder in the recess. With such a design, a high percentage of connector leads in a connector footprint will extend, at least somewhat, into a corresponding recess. That percentage may be greater than 95%, such as greater than 98% or greater than 99%, in some embodiments.

Further, the depth of the recess may be based on the volume of solder required to achieve a reliable connection between the connector lead and the via. For example, the shear strength of the solder joint may be enhanced by providing a recess having a greater depth. The depth of the recess is limited in the case of a conical or truncated conical shape, due to the requirement for maintaining a minimum wall thickness of the via in the region of the recess. As shown in FIG. 4, the wall thickness 430 of truncated conical via 420 decreases as the depth of via 420 is increased. In some embodiments, the depth of the recess may be in a range of 0.05 mm to 0.30 mm, but this is not a limitation.

A minimum wall thickness of the via in the region of the recess is maintained to ensure electrical continuity of the via. As shown in FIG. 5, the via 510 has a wall thickness 530 in the region of cylindrical recess 520. The depth of cylindrical recess 520 can be increased without decreasing the wall thickness 530. However, in the case of truncated conical recess 420 or conical recess 380, a wall thickness 430 decreases as the depth of the recess is increased. Thus, the depth of a conical or truncated conical recess is limited, depending on the required wall thickness and the angle of the conical portion of the recess. The wall thickness of the via in the region of the recess may be in a range of 0.02 mm to 0.08 mm, but this is not a limitation.

Figure 7A:
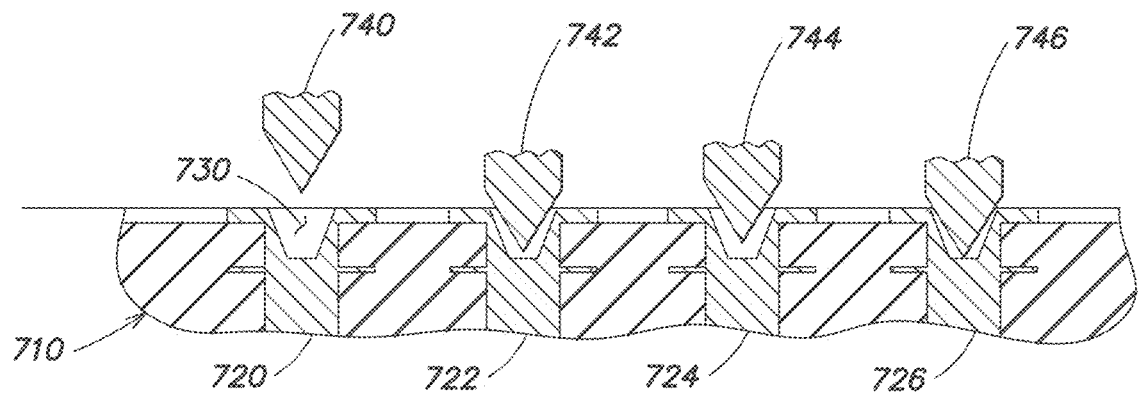
FIGS. 7A-7C are cross sections of a printed circuit board which illustrate solder joints between connector leads of a surface mount connector and a printed circuit board in accordance with embodiments.
Figure 7B:
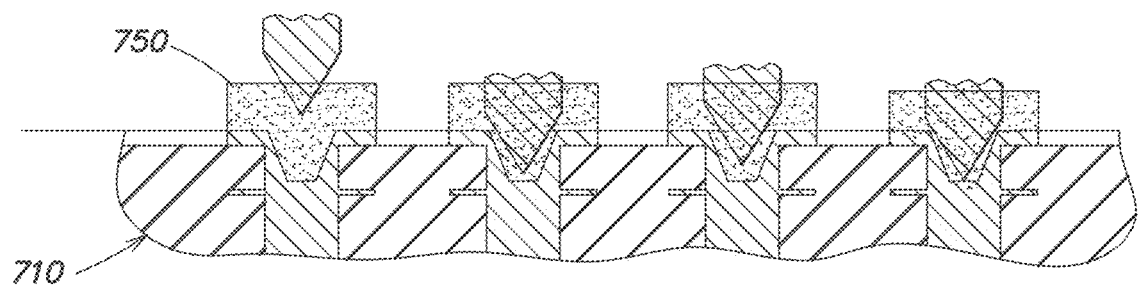
Figure 7C:
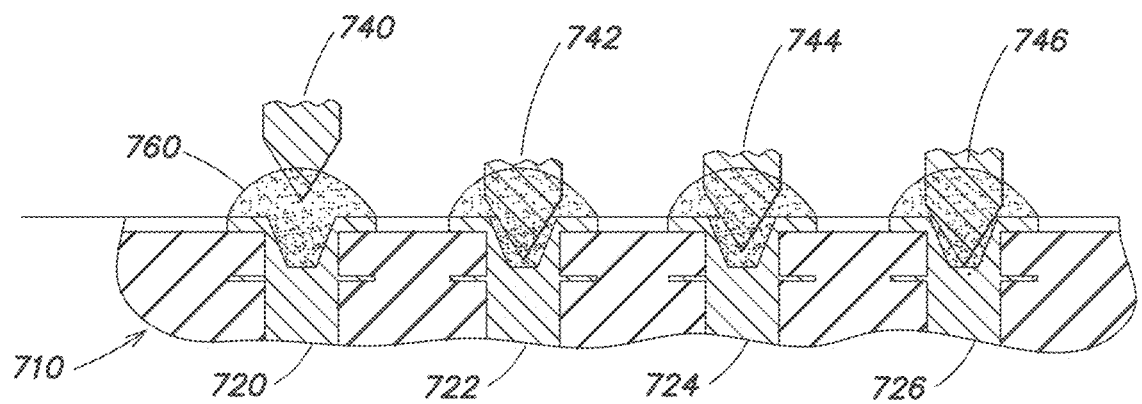

A printed circuit board and surface mount connector leads, illustrating compensation for lack of coplanarity of the connector leads in accordance with embodiments, is illustrated in FIGS. 7A-7C. A printed circuit board 710 is provided with vias 720, 722, 724 and 726, each having a truncated conical recess 730. Connector leads 740, 742, 744 and 746 of a surface mount connector engage the vias 720, 722, 724 and 726, respectively. Connector leads 740, 742, 744 and 746 lack coplanarity such that connector lead 740 has the shortest length, connector lead 746 has the greatest length, and connector leads 742 and 744 have intermediate lengths. Connector lead 746 is fully inserted into the recess of via 726, whereas connector lead 740 is positioned slightly above via 720.

Solder bricks 750 formed of solder paste are shown in FIG. 7B and solder joints 760 are shown in FIG. 7C after heating of the solder bricks 750. As shown in FIG. 7C, the solder joints 760 connect each of the connector leads 740, 742, 744 and 746 to the respective vias and provide reliable connections. Even connector lead 740 with the shortest length is connected to via 720 by a solder joint. Connector lead 740 is an extreme example of a connector lead that is still connected to a via.

Figure 8A:
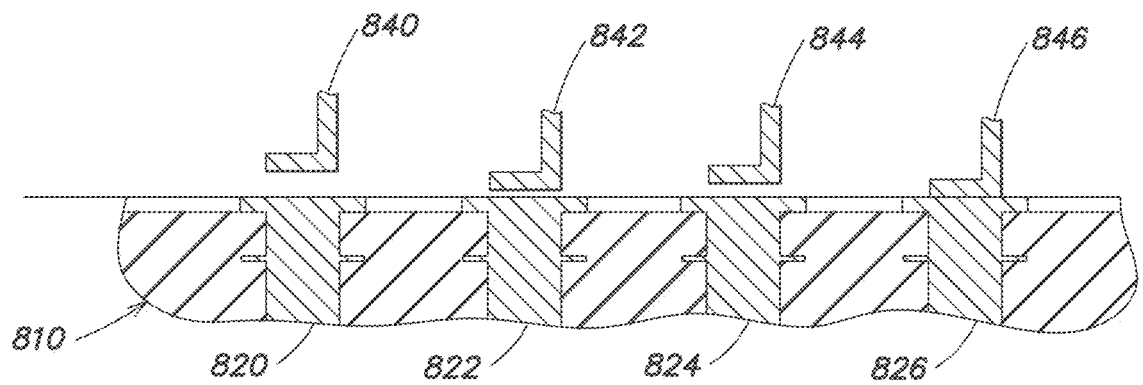
FIGS. 8A-8C are cross sections of a printed circuit board which illustrate solder joints between connector leads of a surface mount connector and a printed circuit board in accordance with the prior art.
Figure 8B:
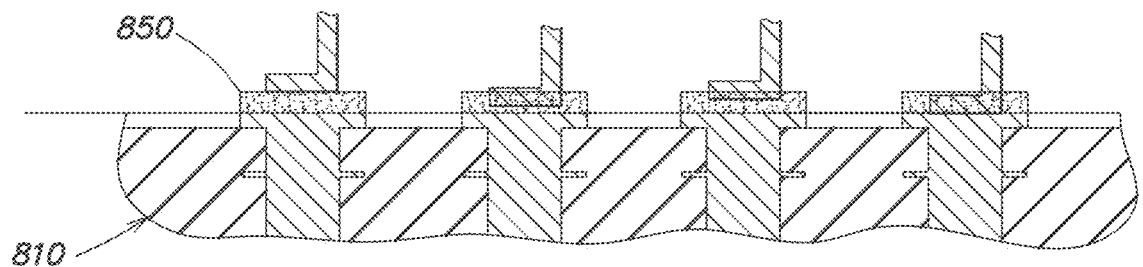
Figure 8C:
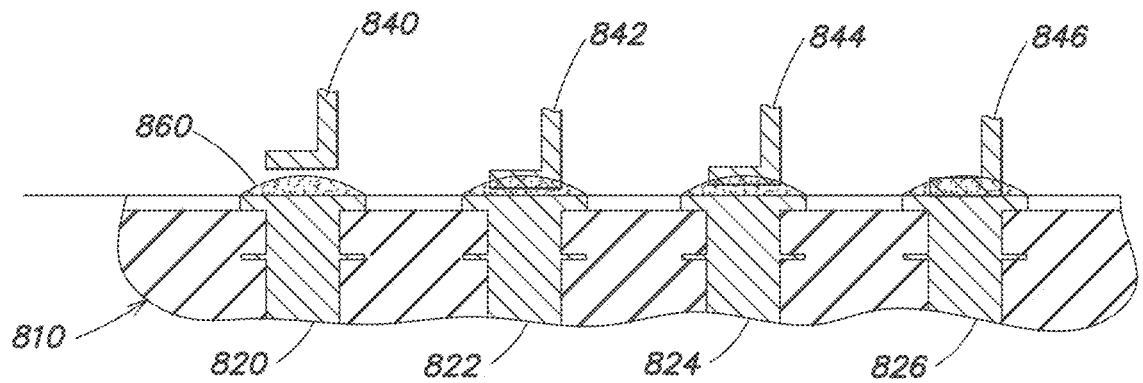

A prior art printed circuit board and surface mount connector leads are shown in FIGS. 8A-8C. A printed circuit board 810 includes vias 820, 822, 824 and 826, each having a flat upper surface. Surface mount connector leads 840, 842, 844 and 846 correspond to the vias 820, 822, 824 and 826, respectively. The connector leads 840, 842, 844 and 846 may have flat bottom surfaces for improved contact with the respective vias. The illustrated configuration results from the connector leads, which have broadsides connected by edges, being bent such that the broad sides are parallel to the printed circuit board 810. Connector leads 840, 842, 844 and 846 lack coplanarity such that connector lead 840 has the shortest length, connector lead 846 has the greatest length, and connector leads 842 and 844 have intermediate lengths. Solder bricks 850 are shown in FIG. 8B, and solder joints 860 after heating of the solder bricks are shown in FIG. 8C. As shown in FIG. 8C, the connector lead 840 may not make contact with the via 820 as a result of its shorter length, resulting in a defective solder joint.

Solder bricks are typically made up of 50% metal particles in the shape of spheres and 50% flux and other volatiles. The volatiles evaporate by the end of the thermal cycle, resulting in a metal volume that is one half of the original solder brick volume. The reduction in solder brick volume presents a challenge to bridging the gaps caused by variation in surface mount lead length.

The printed circuit board having vias and/or other conductive elements with recesses as described herein provides enhanced reliability as compared with prior art printed circuit boards. In particular, the recesses compensate for lack of coplanarity of the tip portions of the connector leads of the surface mount connector. In addition, the recesses permit increased solder volume, increased solder joint surface area and increased shear resistance as compared with prior art vias having flat surfaces, and therefore the reliability of each solder joint is increased. In some embodiments, the coplanarity specification of the connector leads of the surface mount connector may be relaxed when the vias are provided with recesses.

By eliminating the need for vias of sufficient size to receive contact tails of a press fit connector, the diameters of the vias in a region near the top surface of the printed circuit board can be reduced. The reduced via diameters permit closer center-to-center spacing of vias and permit routing of signal traces in the region near the top surface of the printed circuit board.

A top view of a printed circuit board having via patterns in accordance with embodiments is shown in FIG. 9. A printed circuit board 910 includes via patterns 920, 922, 924 and 926. Each via pattern is configured for solder attachment to connector leads of a surface mount connector as described herein. The printed circuit board may include any number of via patterns. The via patterns may be arranged in rows and columns, and the rows and/or columns may be aligned to form a grid or may be offset. In some embodiments, multiple surface mount connectors 100 may be held together with a housing or other support member as modules of a larger connector. Those modules may be held in the housing in a pattern matching the pattern of via patterns shown in FIG. 9, for example.

As further shown in FIG. 9, via pattern 920 may include signal vias 930 and 932, which form a differential signal pair, and ground vias 940, 942, 944 and 946. The via pattern 920 may further include shadow vias 950, 952, 954 and 956 which interconnect ground planes of the printed circuit board but are not connected to the surface mount connector. In addition, via pattern 920 may include an antipad 960, which is an area around signal vias 930 and 932 in which the conductive layer on the top surface of printed circuit board 910 has been removed. It will be understood that the via patterns may have a variety of configurations depending at least in part on the configuration of the surface mount connector and the operating frequency.

Each via pattern shown in FIG. 9 is configured for solder attachment to a surface mount connector (not shown in FIG. 9). The surface mount connector may include signal leads that are attached to the respective signal vias 930 and 932 and ground leads that are attached to the respective ground vias 940, 942, 944 and 946. The signal vias 930 and 932 and the ground vias 940, 942, 944 and 946 may be provided with recesses as described herein so as to enable reliable solder attachment between the surface mount connector and the printed circuit board 910. The shadow vias 950, 952, 954 and 956 are not attached to the surface mount connector and may not be provided with recesses.

In one example, the signal vias 930 and 932 of via pattern 920 may have diameters of 0.25 mm and be spaced by 0.90 mm. The ground vias 940, 942, 944 and 946 may have diameters of 0.20 mm and may extend through the printed circuit board 910. The overall via pattern 920 may have dimensions of 2.0 mm or less and may be spaced from other via patterns by 2.0 mm or less. It will be understood that these dimensions are given by way of example and are not limiting.

A printed circuit board configured for attachment to a conventional press fit connector may have a similar layout to the via patterns 920, 922, 924 and 926 shown in FIG. 9 and described above. However, because the press fit connector relies upon contact tails that are inserted into respective vias in the printed circuit board, the dimensions of a press fit via pattern are larger than the dimensions of a surface mount via pattern as described herein. In particular, the signal vias and the ground vias configured to accept contact tails of a press fit connector are larger in diameter than corresponding vias configured for solder attachment to a surface mount connector, and the center-to-center spacing between vias is larger to achieve a desired impedance and to limit crosstalk between conductors. Accordingly, it is possible to achieve greater miniaturization using surface mount connectors and the printed circuit boards described herein, as compared with press fit connectors and corresponding printed circuit boards.

Referring again to FIG. 1, a transition region 190 between surface mount connector 100 and printed circuit board 110 includes a lower region of surface mount connector 100 adjacent to printed circuit board 110 and an upper region of printed circuit board 110 adjacent to surface mount connector 100. In the transition region 190, it is desirable to control the impedances of the signal transmission lines to avoid impedance variations and discontinuities. This may be difficult to achieve since the surface mount connector 100 and the printed circuit board 110 have different structures and different materials. In some embodiments, impedance variations can be controlled by controlling the spacing and dimensions of the conductors in the connector 100 and in the printed circuit board 110 and by controlling the dielectric constants of the materials of the connector 100 and the printed circuit board 110, for example.

In some embodiments, the connector leads of the surface mount connector may be formed of superelastic materials. For example, the signal leads 120 and 122 shown in FIGS. 1 and 2 may be formed of superelastic materials. Use of superelastic materials can enable the overall density of the printed circuit board via patterns to be increased.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A printed circuit board comprising:
   at least one dielectric layer; and
   at least one conductive element formed on the dielectric layer and configured for solder attachment to a connector lead of a surface mount connector, the conductive element having a recess in a surface thereof, wherein the recess is configured to be smaller in diameter than the connector lead and is configured to receive only a tip portion of the connector lead, wherein the conductive element is part of a via that extends through the dielectric layer, wherein the at least one dielectric layer comprises a plurality of layers including conductive layers separated by dielectric layers, and the via extends from an upper surface of the printed circuit board through one or more of the plurality of layers, and wherein the via is configured for attachment to a superelastic connector lead of the surface mount connector.

2. The printed circuit board as defined in claim 1, wherein the recess has a depth in a range of 0.05 mm to 0.30 mm.

3. The printed circuit board as defined in claim 1, wherein the recess includes at least one of a conical portion, a truncated conical portion, and a hemispherical portion.

4. The printed circuit board as defined in claim 1, wherein the recess is configured to allow a tip portion of the connector lead of the surface mount connector to extend below the upper surface of the printed circuit board.

5. The printed circuit board as defined in claim 1, wherein the via includes a conductive pad on the upper surface of the printed circuit board and wherein the conductive pad has a larger diameter than the conductive element of the via.

6. A printed circuit board comprising:
   a plurality of layers including conductive layers separated by dielectric layers; and
   via patterns formed in the plurality of layers, each of the via patterns comprising:
     first and second signal vias extending from a first surface of the printed circuit board to a breakout layer of the conductive layers; and
     ground vias connected to one or more of the conductive layers, wherein the signal vias and the ground vias each include a conductive element having a recess in a surface thereof, wherein each conductive element is configured for solder attachment to a connector lead of a surface mount connector and wherein the recess is configured to be smaller in diameter than the connector lead and is configured to receive only a tip portion of the connector lead.

7. The printed circuit board as defined in claim 6, wherein each recess has a depth in a range of 0.05 mm to 0.30 mm.

8. The printed circuit board as defined in claim 1, wherein the conductive element has a wall thickness in a region of the recess in a range of 0.02 mm to 0.08 mm.

9. The printed circuit board as defined in claim 1, wherein the recess has an aspect ratio of depth to width in a range of 1 to 4.

10. A printed circuit board comprising:
    a plurality of layers including conductive layers separated by dielectric layers; and
    at least one via pattern formed in the plurality of layers, the via pattern comprising:
      first and second signal conductors for attachment of respective first and second signal leads of a component to an upper surface of the printed circuit board and for connection of the first and second signal leads of the component to a breakout layer of the conductive layers; and
      at least one ground conductor for attachment to a ground lead of the component and for connection of the ground lead of the component to a ground plane of the conductive layers, wherein each of the first and second signal conductors and the at least one ground conductor has a recess in a surface thereof and wherein the recess is configured to be smaller in diameter than the connector lead and is configured to receive only a tip portion of the connector lead.

11. The printed circuit board as defined in claim 10, wherein the first and second signal conductors are configured for connection to the first and second signal leads of the component at the upper surface of the printed circuit board.

12. The printed circuit board as defined in claim 10, wherein the first and second signal conductors include signal vias that extend through the layers of the printed circuit board to the breakout layer.

13. The printed circuit board as defined in claim 10, wherein the at least one ground conductor includes a ground via that extends through one or more layers of the printed circuit board to the ground plane.

14. The printed circuit board as defined in claim 10, wherein the first and second signal conductors are configured for solder attachment to the first and second signal leads of the component.

* * * * *